United States Patent [19]

McCollum et al.

[11] Patent Number: 5,070,384
[45] Date of Patent: Dec. 3, 1991

[54] ELECTRICALLY PROGRAMMABLE ANTIFUSE ELEMENT INCORPORATING A DIELECTRIC AND AMORPHOUS SILICON INTERLAYER

[75] Inventors: John L. McCollum, Saratoga; Shih-Ou Chen, Fremont, both of Calif.

[73] Assignee: Actel Corporation, Sunnyvale, Calif.

[21] Appl. No.: 508,306

[22] Filed: Apr. 12, 1990

[51] Int. Cl.⁵ .............................................. H01L 27/02
[52] U.S. Cl. ...................................... 357/51; 437/193; 57/54; 57/67; 57/71
[58] Field of Search ..................... 357/51, 236, 54, 67, 357/71; 437/193

[56] References Cited

U.S. PATENT DOCUMENTS

| | | |
|---|---|---|
| 4,748,490 | 5/1988 | Hollingsworth ..................... 357/51 |
| 4,823,181 | 4/1989 | Mohsen et al. ........................ 357/51 |
| 4,876,220 | 10/1989 | Mohsen et al. ........................ 437/51 |
| 4,899,205 | 2/1990 | Hamdy et al. ......................... 357/51 |

Primary Examiner—Andrew J. James
Assistant Examiner—T. Davenport
Attorney, Agent, or Firm—Kenneth D'Alessandro

[57] ABSTRACT

An electrically programmable antifuse element incorporates a composite interlayer of dielectric material and amorphous silicon interposed between two electrodes. The lower electrode may be formed from a refractory metal such as tungsten. Preferably, a thin layer of titanium is deposited over the tungsten layer and its surface is then oxidized to form a thin layer of titanium oxide which serves as the dielectric material of the composite dielectric/amorphous silicon interlayer. A layer of amorphous silicon is then deposited on top of the titanium oxide dielectric to complete the formation of the composite interlayer. A topmost layer of a refractory metal such as tungsten is then applied over the amorphous silicon to form the topmost electrode of the antifuse.

41 Claims, 4 Drawing Sheets

ELECTRICALLY PROGRAMMABLE ANTIFUSE ELEMENT INCORPORATING A DIELECTRIC AND AMORPHOUS SILICON INTERLAYER

BACKGROUND OF THE INVENTION

1. Field of the Invention

This invention relates to integrated electronic circuit technology. More particularly, this invention relates to electrically programmable antifuse elements.

2. The Prior Art

Integrated electronic circuits are usually fabricated with all internal connections set during the manufacturing process. However, because of high development costs and high manufacturing tooling costs of such circuits, it is advantageous if such circuits can be configured or programmed by the user for a specific application. Such circuits are called programmable circuits and are programmed by either selectively breaking or creating a series of programmable links. Programmable links are electrical interconnects which are broken or created at selected electronic nodes in the circuit by the user after the integrated circuit device has been fabricated and packaged. Such programming is undertaken in order to activate or deactivate, respectively, the selected electronic nodes such that the PROM can be programmed to perform a desired function.

Fusible links have been used extensively in PROM devices and are well known. A PROM device usually consists of an X-Y matrix or lattice of conductors or semiconductors. At each cross-over point of the lattice, a conducting link connects a transistor or other electronic node to the lattice network. The PROM is programmed by providing a high programming current to predesignated fusible links which connect to selected nodes. Links are then blown out to create an open circuit. The combination of blown and unblown fusible links represents a digital bit pattern of ones and zeros signifying data which the user wishes to store in the PROM.

Fusible link PROM systems present certain disadvantages. For example, relatively high programming voltages and high current levels are needed during programming to guarantee the complete blowing out of the fusible links. Since the fusible link is usually conductive, excessive power dissipation may be necessary in order to blow out the link and thus program the device. Also, the shape and size of the fusible links must be very precisely controlled so that the link will function effectively as a conductor if it is not blown out. Conversely, the fusible link must be a completely open circuit if it is blown. Therefore, very critical photolithographic steps and controlled etched techniques are required during the manufacturing of fusible link PROMs. Such precise dimensional tolerances are difficult and expensive to attain. In addition, a large gap must be blown in the fusible link in order to prevent it from later closing by reason of the accumulation of conducting material near the blown gap. Accordingly, fusible link memory cells must be disadvantageously large in order to accommodate the fusible link and an associated selection transistor which develops the high current needed to blow the link. Fusible links therefore take up an excessively large amount of valuable space on a semiconductor chip and have high manufacturing and material costs.

Another type of programmable link, called an antifuse link, has been developed for use in integrated circuit applications in order to overcome the foregoing disadvantages of fusible links. Instead of a programming mechanism for causing an open circuit as is the case with the fusible link, the programming mechanism for an antifuse creates a short circuit or relatively low resistance link. Antifuse links consist typically of two conductor and/or semiconductor elements having some kind of a dielectric or insulating material between them. During programming, the dielectric at selected points between the conductive elements is broken down by a current developed from a predetermined programming voltage applied to the conductive elements of selected links to thereby electrically connect the conducting or semiconducting elements.

Various materials have been suggested for both the conducting elements and the dielectric or insulating layer. Some of these suggested dielectric materials require a relatively high current and voltage during programming and therefore demand complex manufacturing techniques. Such antifuse elements have low reliability during programming because it is difficult to control the reproducability of the conductive state due to the nature of the crystalline structures of the dielectric layer.

In addition, the programming process results in a link having a finite resistance on the order of several hundred to several thousand ohms. This characteristic of known antifuse elements renders them relatively unsuitable for use in high speed circuits. Such increased resistance results in high impedance and unacceptably high power consumption when several thousand circuits are switching simultaneously.

Prior art antifuse devices are typically one of two major types depending upon the dielectric or insulating material which comprises the interlayer disposed between the two conductive elements. Dielectric antifuses typically employ silicon dioxide or a multilayer sandwich of silicon dioxide and silicon nitride. Antifuse elements employing a dielectric interlayer are disadvantageous because they require programming voltages on the order of 16 to 20 volts in order to be programmed and still remain reliable at normal operating voltages of 5 volts. In order to program dielectric type antifuses so that they maintain reliable operation at 5 volts, the dielectric thickness must be on the order of 100 Å. Such a thin interlayer has the disadvantage of producing a relatively high capacitance. This can severely limit device operating speed because numerous unblown antifuses on a single line act as capacitors linked in parallel. The sum of the individual capacitances of the unblown antifuses therefore may be quite high and may drastically slow down data signals.

Another possible drawback of known dielectric antifuses containing silicon dioxide or a multilayer sandwich of silicon dioxide and silicon nitride is that a high temperature low pressure chemical vapor deposition (LPCVD) process must be used in order to deposit the thin oxide layer, or nitride layer with good uniformity and film controllability. However, the high temperature LPCVD process may have the disadvantage of inducing the formation of hillocks on the first metallic layer. The hillock formations may extend through the 100 Å thin oxide and cause multiple short circuits between the first and second metallic layers, so it is advisable to avoid hillocks between metal layers.

The second type of prior art antifuse typically comprises an interlayer of amorphous silicon sandwiched between first and second layers of metal. The antifuses incorporating an amorphous silicon interlayer provide a thickness on the order of twenty times greater for the same programming voltage as compared to the dielectric antifuses with the 100 Å or less thin oxide or thin nitride layers. However, amorphous silicon antifuses have the disadvantage of extremely high leakage currents. The high leakage current inherent in the use of amorphous silicon can create a serious problem in terms of the controllability of the programming voltage. High leakage current can also cause severe storage time degradation in MOS devices. Thus, prior art amorphous silicon antifuses have serious programmability problems In addition, an amorphous silicon antifuse may be prone to crack propagation and continuity failure after long hours of operation.

In order to overcome the foregoing disadvantages of prior art antifuses wherein the interlayer consists exclusively either of a dielectric or an amorphous silicon material, it is an object of the present invention to provide an electrically programmable low impedance antifuse which may be programmed with programming voltages of 18 volts or less in order to maintain reliable low impedance operation at standard MOS device operating voltage of 5 volts.

It is yet a further object of the present invention to provide a antifuse element having a well-controlled programming voltage which will provide an improved degree of uniformity in the formation of the ohmic contact between the conducting elements and will advantageously require a lower programming voltage.

It is another object of the present invention to provide a plurality of electrically programmable antifuse elements with substantially reduced parasitic capacitance for use in a PROM device which will result in faster speed and greatly reduced power consumption when several thousand gates are switching simultaneously.

It is yet another object of the present invention to provide an electrically programmable antifuse element which substantially eliminates leakage currents, crack propagation and continuity failure inherent in a prior art amorphous silicon antifuse elements and thereby greatly improve the memory storage reliability and useful lifetime of a PROM device incorporating a plurality of antifuse elements. Other and further advantages of the present invention will appear hereinafter.

SUMMARY OF THE INVENTION

In order to overcome the above discussed disadvantages of known antifuse elements, an electrically programmable low impedance antifuse element is disclosed, a plurality of which may be integrated on a semiconductor substrate. The antifuse of the present invention may be fabricated on a semiconductor substrate and comprises a lower first electrode, a dielectric material disposed over the lower electrode, and an upper second electrode disposed above the dielectric material. A layer of amorphous silicon is interposed between the dielectric layer and the upper electrode such that current leakage and parasitic capacitances between the lower and upper electrodes are substantially eliminated.

The antifuse element according to the present invention utilizes a combination of dielectric material and amorphous silicon as the interlayer interposed between the two opposed conductive electrodes. In a preferred embodiment, the two electrodes may be formed using conventional processing techniques and may comprise conductive layers which may be formed from a refractory metal such as tungsten, molybdenum, platinum, titanium (or titanium nitride), tantalum or silicides of those metals or arsenic-doped polysilicon. The lower electrode also may be connected to a doped diffusion region within the silicon substrate or to a metal layer via a contact. A passivation layer of boron, phosphorus, silicon, glass (BPSG) may overlay the silicon substrate as is well known in the art. The layer of refractory metal comprising the lower electrode makes ohmic contact with the diffusion region through a gap etched in the passivation layer.

The lower electrode is preferably formed from a layer of tungsten applied by deposition in accordance with well known techniques. In the preferred embodiment, a thin layer of titanium is deposited over the tungsten.

In accordance with one aspect of the invention, the upper layer of titanium is oxidized to form a layer of titanium oxide. The titanium oxide layer also becomes the dielectric material of the composite dielectric/amorphous silicon interlayer interposed between the lower and upper electrodes.

A doped or undoped amorphous silicon layer is deposited on top of the titanium oxide dielectric to complete the formation of the interlayer. The amorphous silicon layer may consist of a sandwich of doped and undoped layers of amorphous silicon, with the doped layer adjacent to the dielectric layer. In other applications, it is possible to create a sandwich of doped polysilicon and undoped amorphous silicon, with the doped polysilicon layer adjacent to the dielectric layer.

An upper electrode is formed over the layer of amorphous silicon to provide the second electrode and thus complete the formation of the antifuse element.

In an alternate embodiment, the dielectric material may be deposited rather than grown. The dielectric layer could also be a nitride, nitride oxide sandwich, oxide nitride sandwich, or a oxide nitride oxide sandwich. After the formation of dielectric layer, an arsenic doped polysilicon layer may be deposited to provide controlled resistance of the antifuse if desired, prior to the formation of the amorphous silicon layer.

DETAILED DESCRIPTION OF THE PREFERRED EMBODIMENT

Figure 1:
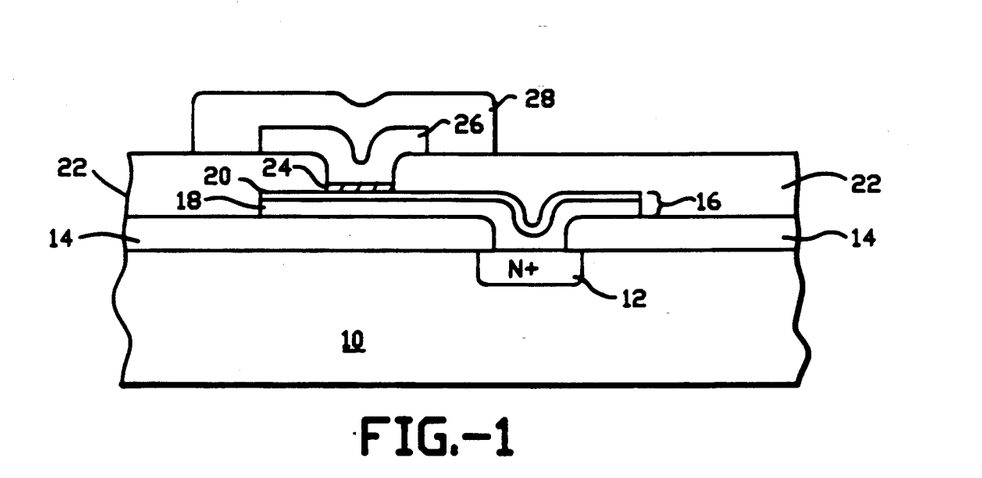
FIG. 1 is a cross section of a preferred embodiment of an antifuse element utilizing a dielectric layer and an amorphous silicon layer between two conductive electrodes in accordance with the present invention.

Referring now to FIG. 1, a preferred embodiment of the present invention is fabricated on a semiconductor substrate 10. Those of ordinary skill in the art will readily recognize that substrate 10 may in fact be a well region of one conductivity type fabricated in a semiconductor substrate of opposite conductivity type as is common in a CMOS process.

In this embodiment, the lower or first electrode of the antifuse may be connected to a diffusion region 12 which may be implanted in substrate 10 by any of the known methods for creating such regions. First diffusion region 12 is preferably a heavily doped diffusion area in substrate 10 and may, for example have a dopant concentration on the order of from $1 \times 10^{19}$ to $1 \times 10^{21}$ atom/cm$^3$ of arsenic or phosphorus if N− type. Arsenic is the preferred dopant for the diffusion region. Diffusion region 12 should have a conductivity type opposite in polarity to that of the substrate 10. Therefore, if substrate 10 is P+ type material, diffusion region 12 should be heavily doped N− type diffusion and vice versa.

As is common in CMOS processes, a BPSG passivation layer 14 is typically provided above silicon substrate 10. As will be appreciated by those of ordinary skill in the art, passivation layer 14 must be etched to expose diffusion region 12 at a point where an antifuse element is located in order to form a contact thereto so that diffusion region 12 may make electrical contact with the overlying metal layer which serves as the lower electrode of the antifuse.

Next, the lower electrode 16 of the antifuse is formed. In the preferred embodiment, the lower electrode 16 of the antifuse element comprises a composite layer including a first refractory metal layer 18, such as tungsten, and a second layer 20 formed from a barrier metal such as titanium disposed conformably above the first metal layer 18. The barrier layer 20 of titanium substantially reduces electromigration. Other suitable materials for the lower electrode include a refractory metal such as tungsten, molybdenum, platinum, titanium (or titanium nitride), tantalum or silicides of those metals or arsenic doped polysilicon.

In the preferred embodiment, metal layer 18 has a thickness in the range of about 1,000 Å to 2μ. Preferably, the thickness of metal layer 18 is on the order of 5,000 Å. In the embodiment shown, barrier metal layer 20 comprises a thin layer of titanium having a thickness preferably on the order of 500 Å. However, a thickness in a range of from about 100 Å to 1,000 Å would also be practical. After its formation, the composite lower electrode 16 is then etched using conventional techniques to provide both metal interconnects and lower electrodes for antifuses. The use of a titanium layer 20 enables an antifuse to be fabricated by low temperature processes by utilizing the low activation energy of titanium to titanium dioxide (TiO$_2$).

Preferably, an insulating layer 22 is placed over the titanium layer 20. Insulating layer 22 is etched through in accordance with conventional techniques to expose titanium layer 20 at a point where an antifuse element is to be located.

Next, a dielectric layer 24 is formed over the surface of the lower electrode. In a presently preferred embodiment, dielectric layer 24 may be formed by oxidizing the surface of titanium layer 20 in accordance with well-known low temperature processes to produce a thin layer of titanium dioxide in the etched region. When formed from titanium dioxide, dielectric layer 24 has a preferred thickness of approximately 100 Å. However, thicknesses in a range of from about 50 Å to 150 Å would also be practical.

It will be appreciated that the utilization of the low activation energy of titanium to titanium dioxide in accordance with the present invention avoids the need for high temperature LPCVD processes in order to deposit dielectric layers with uniformity. As noted previously, high temperature LPCVD processes may induce hillock formations and other nonconformities on the first metal layer 18 which may degrade antifuse performance.

In accordance with another aspect of this invention, an amorphous silicon layer 26 is formed above the dielectric layer 24. Amorphous silicon layer 26 has a preferred thickness on the order of 2,000 Å assuming a programming voltage of about 16 v, but a range of thickness from about 1,000 Å to 2,500 Å is practical, depending on the desired programming voltage. If desired, amorphous silicon layer 26 may be doped with phosphorus or arsenic to a level of about $1 \times 10^{20}$ atoms/cm$^3$ for the purpose of lowering its resistance.

The employment of the composite interlayer comprising dielectric layer 24 and amorphous silicon layer 26 also has the advantage of substantially eliminating parasitic capacitances and leakage currents which are so common in prior art antifuse elements. The parasitic capacitance may be substantially eliminated because of the increased spacing between the lower and upper electrodes afforded by the composite dielectric and amorphous silicon interlayer.

Upper electrode 28 lies above amorphous silicon layer 26. Suitable materials for the upper electrode include a refractory metal such as tungsten, molybdenum, platinum, titanium (or titanium nitride), tantalum or silicides of those metals or arsenic doped polysilicon. In a presently preferred embodiment, the upper electrode 28 may be formed by a barrier metal layer disposed above and surrounding the amorphous silicon layer 26.

In a presently preferred embodiment, upper electrode 28 comprises a layer of tungsten, but also may be comprised of any refractory metal. Upper electrode 28 may be deposited according to conventional processing techniques and may have a thickness in a range of from about 1,000 Å to 2μ. Preferably, the thickness of upper electrode 28 is about 8,500 Å. Other materials suitable for use as the upper electrode include arsenic doped polysilicon, formed using conventional semiconductor processing techniques.

It will be appreciated that amorphous silicon layer 26 in combination with subjacent dielectric layer 24 also has the advantage of substantially eliminating defect densities such as crack propagation, continuity failure, and other structural defects which cause leakage currents since such defects would have to appear simultaneously at the same point in both the dielectric layer 24 and amorphous silicon layer 26. Thus, the novel combination of dielectric layer 24 and amorphous silicon layer 24 interposed between the lower electrode and the upper electrode provides greatly enhanced antifuse reliability and memory storage retention than was previously possible.

Figure 2:
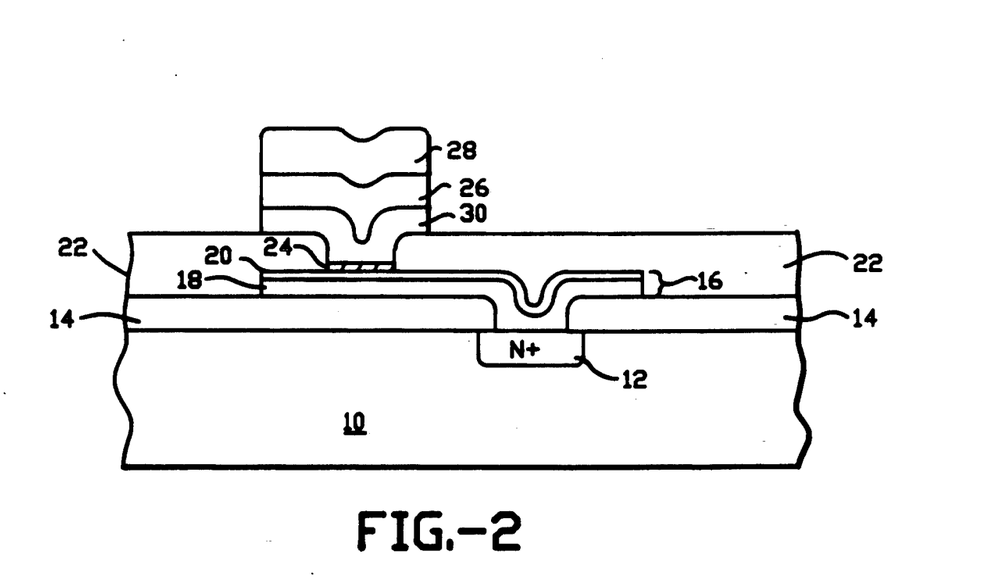
FIG. 2 is a cross section of a alternate embodiment of an antifuse element utilizing a dielectric layer, a doped polysilicon layer and an amorphous silicon layer between two conductive electrodes in accordance with the present invention.

Referring now to FIG. 2, an alternate embodiment of the antifuse of the present invention includes all of the elements of the embodiment of FIG. 1 (given like reference numerals in FIG. 2) but also includes a layer of arsenic doped polysilicon 30 sandwiched in between dielectric layer 24 and amorphous silicon layer 26. The arsenic-doped polysilicon layer 30 should have a thickness on the order of anywhere from about 500 Å to 2,500 Å, preferably from about 1,500 to 2,000 Å. The purpose of the arsenic-polysilicon layer 30 is to reduce the resistance of the antifuse if desired, as taught in U.S. Pat. No. 4,823,181 to Mohsen, et al. and co-pending application, Ser. No. 137,935, filed Dec. 28, 1987 and assigned to the same assignee as the present invention, both of which are expressly incorporated herein by reference. The arsenic dopant concentration should be somewhere on the order of $10^{20}$ atoms/cm$^3$.

In accordance with conventional antifuse programming techniques, the antifuse element of the embodiments of FIGS. 1 and 2 are programmed by applying a voltage source between the lower electrode 16 and the upper electrode 28. The antifuse structure of the present invention advantageously requires a programming voltage having a magnitude of approximately 16 volts. A programming time of less than 5 mSec is typical.

FIGS. 3a-3g describe a presently preferred process for the fabrication of an antifuse element in accordance with the present invention. As shown in FIGS. 3a-3g, the present invention utilizes a conventional metallization processing sequence. It will be appreciated that by adopting the conventional metallization process sequence, the present invention saves at least one processing step when the dielectric layer 24 is formed by oxidizing the titanium layer 20.

Figure 3A:
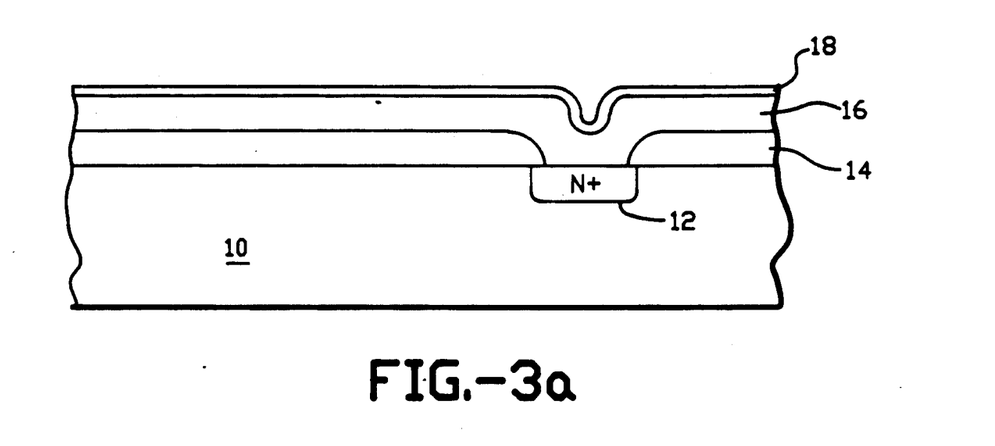
FIGS. 3a–3g show the progressive structures formed during successive points in a typical process for fabricating an antifuse element of the present invention as part of a silicon gate CMOS process.

Referring first to FIG. 3a, the antifuse of the present invention may be fabricated on any conventional silicon substrate 10. The lower electrode 16 of the antifuse element is in ohmic contact with diffusion region 12, and includes a first barrier metal layer 18 preferably composed of tungsten or any refractory metal, and a barrier metal layer 20 preferably of titanium having a thickness on the order of 500 Å. The diffusion region 12 is implanted according to conventional ion implantation techniques after forming an aperture in passivation layer 14 using known methods. After deposition and annealing of the succeeding tungsten layer 18 and titanium layer 20 using conventional semiconductor processing techniques, a slight depression occurs over the diffusion region 12 as shown in FIG. 3a.

Figure 3B:
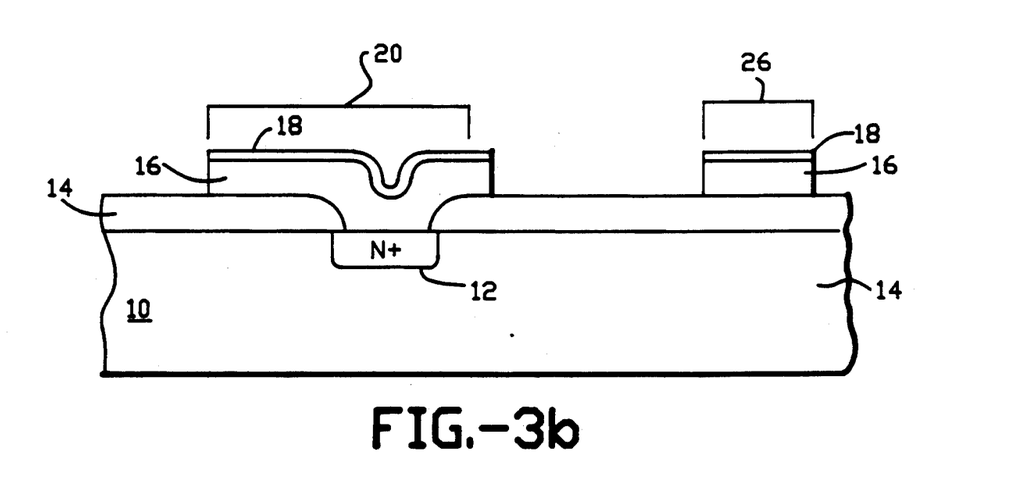

Referring now to FIG. 3b, the layer from which lower electrode 16 will be defined is masked with a masking layer (not shown) and etched in accordance with conventional techniques to define lower electrode 16 of the antifuse and a metal interconnect region 32. It will be appreciated that the lower electrode 16 is defined in the same step as the metal interconnect region 32 in accordance with conventional techniques.

Figure 3C:
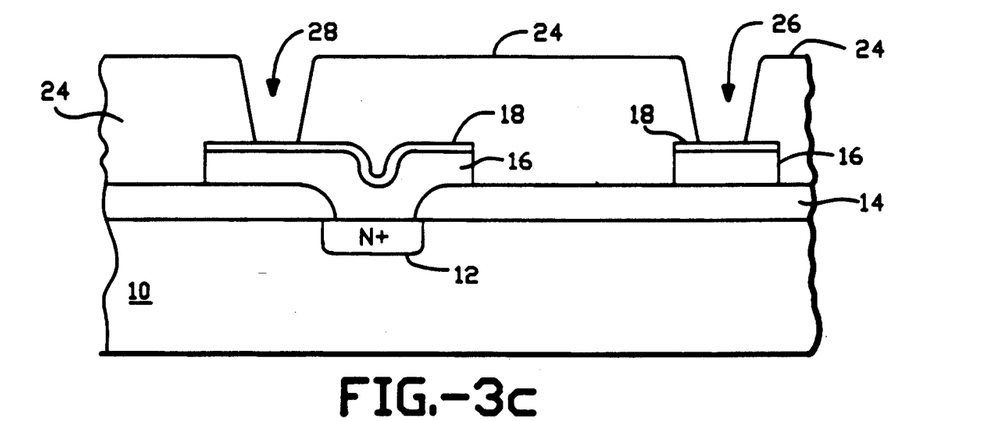

Referring now to FIG. 3c, a conventional layer of insulating oxide 22 is deposited or grown over the etched metal regions. A preferably small geometry opening 34 is formed in oxide layer 22 to expose the upper surface of lower electrode 16 at a point where the antifuse element will be fabricated during the same point in the process when a conventional via opening 36 may also be etched to expose the upper surface of metal interconnect 32 to create a contact thereto.

Figure 3D:
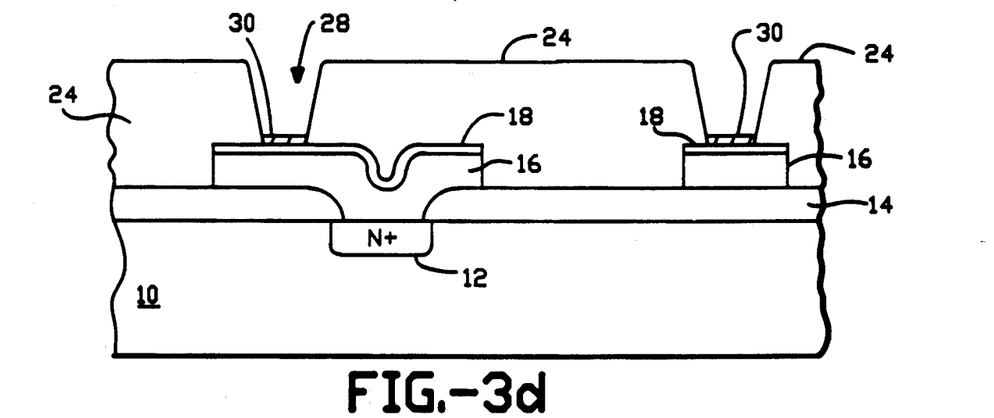

As shown in FIG. 3d, antifuse dielectric layer 24 is formed over the exposed surface of the lower electrode 16. In a preferred embodiment, this may be accomplished by oxidizing the exposed surface of titanium layer 20 by a low temperature process to form a thin layer of titanium dioxide (TiO$_2$) having a preferred thickness of about 100 Å. This preferred method of forming dielectric layer 24 eliminates a separate processing step which would otherwise be necessary for the formation of a dielectric material. According to this preferred embodiment of the invention, the titanium layer 20 serves a dual purpose in that it forms a portion of composite lower electrode 16 and also provides a source for the dielectric material of dielectric layer 24 when oxidized.

In an alternate embodiment of the present invention, a dielectric film could be deposited in small geometry opening 34 to form dielectric layer 24. This dielectric material could be a layer of silicon nitride having a thickness in a range of from about 80 Å to 150 Å; a nitride-oxide or oxide-nitride sandwich wherein the oxide and nitride layers each have thicknesses in the range of from about 25 Å to 50 Å and 40 Å to 80 Å, respectively. The dielectric layer 24 also could be comprised of an oxide-nitride-oxide sandwich wherein the lower oxide may have a thickness of about 20 to 40 Å, the nitride may have a thickness of about 40 to 80 Å and the upper oxide may have a thickness of about 0 to 40 Å. However, the thickness of the dielectric material should be maintained at a minimum in order to utilize low temperature fabrication processes to thereby prevent the introduction of non-conformities in the underlying metal layers 18 and 20. It is therefore most advantageous to simply oxidize titanium layer 20 in order to form the 100 Å thin titanium oxide dielectric layer 24. This completely avoids high temperature fabrication processes in forming a dielectric material and greatly enhances the integrity of the antifuse element.

In another alternate embodiment of the present invention, an arsenic-doped polysilicon layer 30 may be deposited over the dielectric layer 24 at this point in the process using conventional semiconductor processing techniques.

Figure 3E:
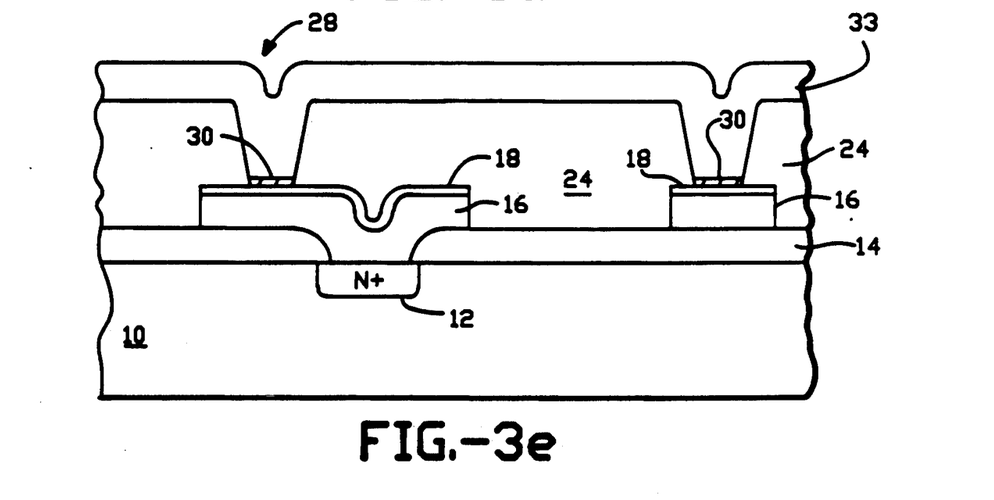

Referring now to FIG. 3e, in a preferred embodiment an amorphous silicon layer 26 having a thickness on the order of approximately 2,000 Å is next deposited over the insulating oxide layer 22 and dielectric layer 24 (or arsenic-doped polysilicon layer 36 as shown in FIG. 3e) using conventional semiconductor processing techniques.

Figure 3F:
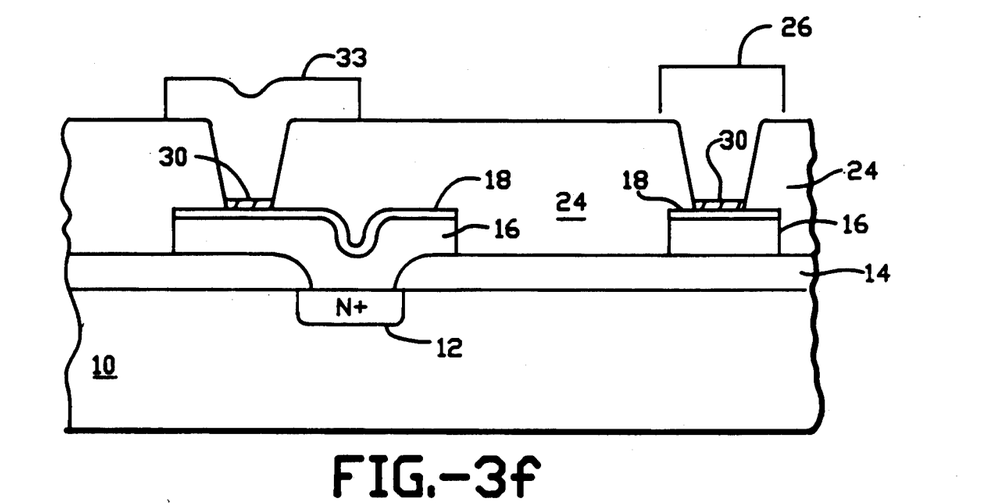

Referring now to FIG. 3f, an antifuse mask (not shown) is placed over the amorphous silicon layer 26 in order to define the antifuse element. The unwanted portions of amorphous silicon layer 26, including the region located in via 36, are then removed by a conventional etching step. FIG. 3f shows the structure resulting after the etching step has been performed. The titanium dioxide in via 36 may be removed by a conventional HF dip prior to formation of metal contact vias.

Figure 3G:
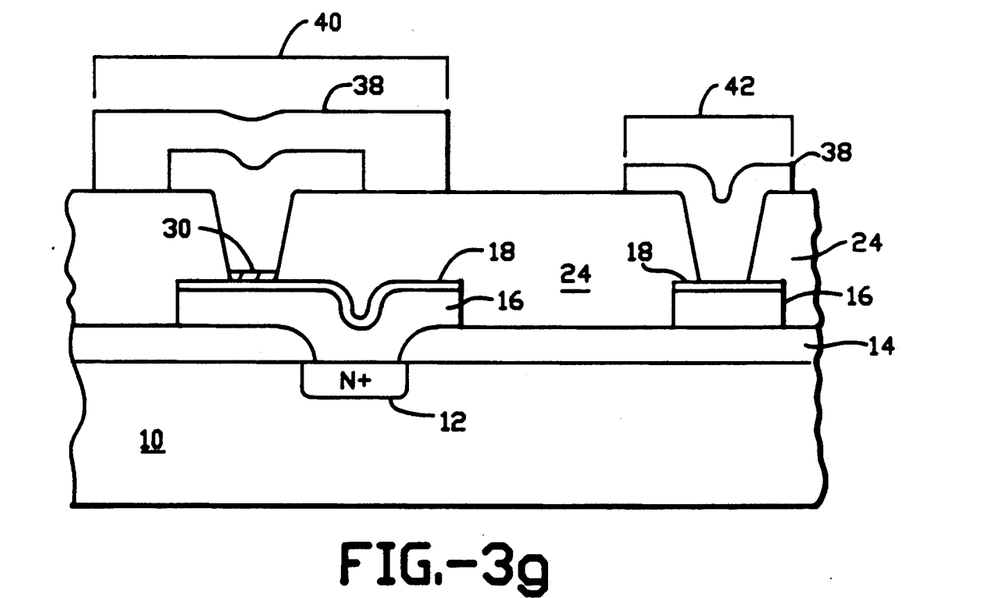

FIG. 3g shows the structure resulting from performance of the final steps in the fabrication of the antifuse element in accordance with the present invention. A metal or other conductive layer, preferably tungsten or other refractory metal, from which upper electrode 28 will be formed, is deposited on the surface of the remaining portion of oxide layer 22 and over the amorphous silicon layer 26. This conductive layer is then masked and etched in order to form the upper electrode 28 and thus complete the definition of the antifuse element as well as to form a metal interconnect in via opening 36 to provide a conductive path to lower electrode 16 as shown in FIG. 3g. The process of manufacturing the remainder of the CMOS circuit can then continue in a standard manner to form a desired electrically programmable memory device.

The antifuse element according to the present invention can also be applied to a bipolar process for fabricating either PROM cells or other programmable logic devices. The preferred embodiment would be the same as the exemplary CMOS embodiment described herein.

The foregoing provides a novel antifuse element wherein a dielectric layer in combination with an amorphous silicon layer provides ease of programming at voltages approximately equal to or less than 20 volts. At the same time, the dielectric/amorphous silicon interlayer provides a significant advantage not attainable in the prior art by substantially eliminating leakage current and parasitic capacitances. This provides a much more efficient antifuse device with greatly increased power savings. The composite interlayer of titanium dioxide dielectric in combination with amorphous silicon also provides the advantage of substantially eliminating continuity defects in the antifuse device such as crack propagation, electro-migration or the like, since such defects would have to occur at the same point in both layers in order to impair operation of the device. Thus, the present invention provides an antifuse which is much more reliable in its operation and which has a greatly enhanced device lifetime in comparison with prior art antifuse devices.

While a presently-preferred embodiment of the invention has been disclosed, those of ordinary skill in the art will, from an examination of the within disclosure and drawings be able to configure other embodiments of the invention. These other embodiments are intended to fall within the scope of the present invention which is to be limited only by the scope of the appended claims.

What is claimed is:

1. An electrically programmable antifuse element disposed on a semiconductor substrate in an integrated circuit comprising:
    a first electrode,
    a dielectric layer disposed over said first electrode,
    an amorphous silicon layer disposed over said dielectric layer,
    a second electrode disposed over said layer of amorphous silicon.

2. The electrically programmable antifuse element of claim 1 further including a layer of arsenic doped polysilicon in between said dielectric layer and said amorphous silicon layer.

3. The electrically programmable antifuse element of claim 1 wherein said first electrode is electrically connected to a diffusion region within said substrate, said diffusion region having a conductivity type opposite to that of said substrate.

4. The electrically programmable antifuse element of claim 2 wherein said first electrode is electrically connected to a diffusion region within said substrate, said diffusion region having a conductivity type opposite to that of said substrate.

5. The electrically programmable antifuse element of claim 1 wherein said first electrode includes a composite layer comprising a first layer of a refractory metal and a layer of titanium over said first layer.

6. The electrically programmable antifuse element of claim 2 wherein said first electrode includes a composite layer comprising a first layer of a refractory metal and a layer of titanium over said first layer.

7. The electrically programmable antifuse element of claim 3 wherein said first electrode includes a composite layer comprising a first layer of a refractory metal and a layer of titanium over said first layer.

8. The electrically programmable antifuse element of claim 4 wherein said first electrode includes a composite layer comprising a first layer of a refractory metal and a layer of titanium over said first layer.

9. The electrically programmable antifuse element of claim 7 wherein said layer of titanium has a thickness in a range from 100 Å to 1,000 Å.

10. The electrically programmable antifuse element of claim 8 wherein said layer of titanium has a thickness in a range from 100 Å to 1,000 Å.

11. The electrically programmable antifuse element of any one of claims 1-10 wherein said dielectric layer is titanium oxide.

12. The electrically programmable antifuse element of any one of claims 1-10 wherein said dielectric layer is titanium oxide having a thickness in the range of from about 50 Å to 150 Å.

13. The electrically programmable antifuse element of claim 1 wherein said amorphous silicon layer has a thickness of from about 1,000 Å to 2,500 Å.

14. The electrically programmable antifuse element of claim 2 wherein said amorphous silicon layer has a thickness of from about 1,000 Å to 2,500 Å.

15. The electrically programmable antifuse element of claim 1 wherein said second electrode comprises a refractory metal having a thickness of from 1,000 Å to 2 microns.

16. The electrically programmable antifuse element of claim 1 wherein said second electrode comprises a refractory metal having a thickness of from 1,000 Å to 2 microns.

17. The electrically programmable antifuse element of claim 2 wherein said layer of arsenic-doped polysilicon has a thickness in the range of from between 500 and 2,500 Å.

18. A semiconductor device disposed on a semiconductor substrate including a plurality of electrically programmable low impedance antifuse elements, each of said antifuse elements comprising:
    a first electrode provided over said substrate,
    a dielectric layer disposed above said first electrode,
    an amorphous silicon layer disposed above said dielectric layer,
    a second electrode provided over said layer of amorphous silicon.

19. The semiconductor device of claim 18 wherein each of said plurality of electrically programmable antifuse elements of further includes a layer of arsenic doped polysilicon in between said dielectric layer and said amorphous silicon layer.

20. The semiconductor device of claim 18 wherein said first electrode of each of said plurality of electrically programmable antifuse elements is electrically connected to a diffusion region within said substrate, said diffusion region having a conductivity type opposite to that of said substrate.

21. The semiconductor device of claim 19 wherein said first electrode of each of said plurality of electrically programmable antifuse elements is electrically connected to a diffusion region within said substrate, said diffusion region having a conductivity type opposite to that of said substrate.

22. The semiconductor device of claim 18 wherein said first electrode of each of said plurality of electrically programmable antifuse elements includes a composite layer comprising a first layer of a refractory metal and a layer of titanium over said first layer.

23. The semiconductor device of claim 19 wherein said first electrode of each of said plurality of electrically programmable antifuse elements includes a composite layer comprising a first layer of a refractory metal and a layer of titanium over said first layer.

24. The semiconductor device of claim 20 wherein said first electrode of each of said plurality of electrically programmable antifuse elements includes a composite layer comprising a first layer of a refractory metal and a layer of titanium over said first layer.

25. The semiconductor device of claim 21 wherein said first electrode of each of said plurality of electrically programmable antifuse elements includes a composite layer comprising a first layer of a refractory metal and a layer of titanium over said first layer.

26. The semiconductor device of claim 22 wherein said layer of titanium in each of said plurality of electrically programmable antifuse elements has a thickness in a range from 100 Å to 1,000 Å.

27. The semiconductor device of claim 23 wherein said layer of titanium in each of said plurality of electrically programmable antifuse elements has a thickness in a range from 100 Å to 1,000 Å.

28. The semiconductor device of any one of claims 18–27 wherein said dielectric layer in each of said plurality of electrically programmable antifuse elements is titanium oxide.

29. The semiconductor device of any one of claims 11–27 wherein said dielectric layer in each of said plurality of electrically programmable antifuse elements is titanium oxide having a thickness in the range of from about 50 Å to 150 Å.

30. The semiconductor device of claim 18 wherein said amorphous silicon layer in each of said plurality of electrically programmable antifuse elements has a thickness of from about 1,000 Å to 2,500 Å.

31. The semiconductor device of claim 19 wherein said amorphous silicon layer in each of said plurality of electrically programmable antifuse elements has a thickness of from about 1,000 Å to 2,500 Å.

32. The semiconductor device of claim 18 wherein said second electrode of each of said plurality of electrically programmable antifuse elements comprises a refractory metal having a thickness of from 1,000 Å to 2 microns.

33. The semiconductor device of claim 19 wherein said second electrode of each of said plurality of electrically programmable antifuse elements comprises a refractory metal having a thickness of from 1,000 Å to 2 microns.

34. The semiconductor device of claim 19 wherein said layer of arsenic-doped polysilicon in each of said plurality of electrically programmable antifuse elements has a thickness in the range of from between 500 and 2,500 Å.

35. The electrically programmable antifuse element of claim 1 wherein said dielectric layer is a layer of silicon nitride.

36. The electrically programmable antifuse element of claim 35 wherein said layer of silicon nitride has a thickness in a range of from about 80 Å to 150 Å.

37. The electrically programmable antifuse element of claim 1 wherein said dielectric layer includes a first layer of silicon nitride, and a second layer of silicon dioxide over said layer of silicon nitride.

38. The electrically programmable antifuse element of claim 37 said first layer of silicon nitride and said second layer of silicon dioxide have thicknesses in the range of from about 25 Å to 50 Å and 40 Å to 80 Å, respectively, over said layer of silicon nitride.

39. The electrically programmable antifuse element of claim 1 wherein said dielectric layer includes a first layer of silicon dioxide, and a second layer of silicon nitride over said layer of silicon dioxide.

40. The electrically programmable antifuse element of claim 39 wherein said first layer of silicon dioxide and said second layer of silicon nitride have thicknesses in the range of from about 25 Å to 50 Å and 40 1 to 80 Å, respectively.

41. The electrically programmable antifuse element of claim 35 wherein said layer of silicon nitride has a thickness in a range of from about 80 Å to 150 Å.

* * * * *